United States Patent [19]

Watson, Jr. et al.

[11] Patent Number: 5,309,035
[45] Date of Patent: * May 3, 1994

[54] METHOD AND APPARATUS FOR CLOCK SKEW REDUCTION THROUGH ABSOLUTE DELAY REGULATION

[75] Inventors: Richard B. Watson, Jr., Harvard; Hansel A. Collins, Clinton; Russell Iknaian, Groton, all of Mass.

[73] Assignee: Digital Equipment Corporation, Maynard, Mass.

[*] Notice: The portion of the term of this patent subsequent to Dec. 21, 2010 has been disclaimed.

[21] Appl. No.: 56,100

[22] Filed: Apr. 30, 1993

Related U.S. Application Data

[63] Continuation of Ser. No. 764,517, Sep. 23, 1991, Pat. No. 5,272,390.

[51] Int. Cl.⁵ .................... H03L 7/00; H03K 5/13
[52] U.S. Cl. .................... 307/269; 307/511; 307/603; 328/63
[58] Field of Search .......... 307/269, 594, 603, 511; 328/63, 65

[56] References Cited

U.S. PATENT DOCUMENTS

| | | | |
|---|---|---|---|
| 3,820,030 | 6/1974 | Williams | 328/63 |
| 4,443,766 | 4/1984 | Belton, Jr. | 328/151 |
| 4,475,085 | 10/1984 | Yahata et al. | 328/62 |
| 4,604,582 | 8/1986 | Strenkowski | 328/55 |
| 4,675,612 | 6/1987 | Adams et al. | 328/63 |
| 4,713,621 | 12/1987 | Nakamura et al. | 328/55 |
| 4,755,704 | 7/1988 | Flora et al. | 307/269 |
| 4,998,025 | 3/1991 | Watanabe | 307/269 |
| 4,999,526 | 3/1991 | Dudley | 307/269 |
| 5,087,829 | 2/1992 | Ishibashi et al. | 307/269 |

OTHER PUBLICATIONS

"VLSI Performance Compensation for Off-Chip Drivers and Clock Generation" by Dennis T. Cox et al. from *Proceedings of IEEE 1989 Custom Integrated Circuits Conference*, pp. 14.3.1–14.3.4.

"Dynamically Tracking Clock Distribution Chip With Skew Control" by Dave Chengson et al. From *Proceedings of IEEE 1990 Custom Integrated Circuits Conference*, pp. 15.6.1–15.6.4.

"A Variable Delay Line Phase Locked Loop For CPU-Coprocessor Synchronization" by Mark G. Johnson et al. from *Proceedings of IEEE 1988 International Solid-State Circuits Conference*, at pp. 142–143.

Primary Examiner—William L. Sikes
Assistant Examiner—Terry D. Cunningham
Attorney, Agent, or Firm—Denis G. Maloney; Albert P. Cefalo

[57] ABSTRACT

An "absolute" delay regulator of a clock repeater chip performs a precise measurement of the propagation delay of a clock signal and adjusts that delay so as to maintain a fixed-phase relationship with an input clock signal. A replica loop accurately replicates the internal path and external loading, including input and output buffers, of the chip. The output of the replica loop drives a delay line whose tapped outputs provide an absolute delay measurement. Results of the measurement are decoded and used to select an appropriate tap to another delay line used to insert a desired amount of delay to an output clock signal.

26 Claims, 14 Drawing Sheets

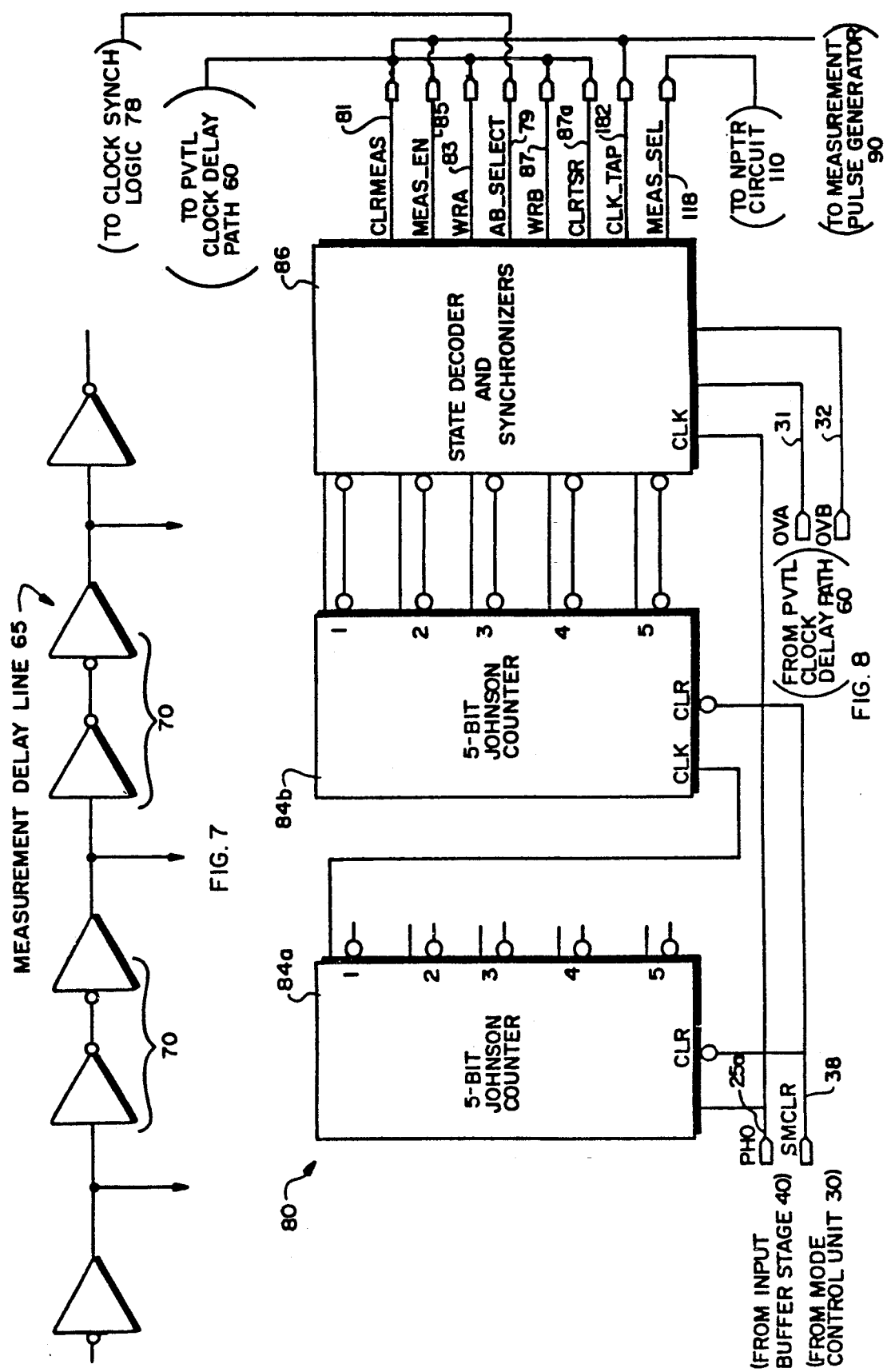

METHOD AND APPARATUS FOR CLOCK SKEW REDUCTION THROUGH ABSOLUTE DELAY REGULATION

This is a continuation of copending U.S. patent application Ser. No. 07/764,517, filed on Sep. 23, 1991, now U.S. Pat. No. 5,272,390.

FIELD OF THE INVENTION

This invention relates generally to computer system buses and, more specifically, to the distribution of clock signals for timing a high speed, synchronous bidirectional bus to modules of the computer system with as little skew as possible.

BACKGROUND OF THE INVENTION

A bus is commonly employed to interconnect modules of a computer system and to transfer signals between them so that desired operations may be carried out by the system. It is also a key element whose characteristics, e.g., speed, have a major impact on the overall performance of the system. In a synchronous computer system having a bidirectional bus, one of the signals transmitted to the modules is a clock signal used to control the timing of the desired operations. Specifically, the clock signal synchronizes the transfer and reception of data between the bus interface circuitry on each module.

For proper operation of the computer system, clock signals should arrive at the interface circuitry at the same time; otherwise, reliable data transmission is not ensured. For example, if a module receiving data is "clocked" later than others, the earlier-clocked modules may overwhelm the data before it is stored at its proper destination. The lack of simultaneity in reception of the clock signals at the modules, i.e., clock skew, directly increases the amount of time that the data must remain stable on the bus; this, in turn, increases the time required for each data transfer on the bus and, thus reduces the speed of the bus.

The amount of clock skew introduced into a computer system is a direct function of the variations in propagation delays among clock receiver chips of the system. A chip, i.e., a small piece of silicon on which integrated circuits are implemented, typically comprises transistors. In digital logic applications, a transistor switches "on", when saturated, and "off", when non-conducting, to generate full swings between power supply voltages. The resulting output voltage "signals" represent corresponding high and low states. Propagation delay, which affects the switching speed of the transistor, is highly dependent upon variations in the fabrication process of the chip. In addition, the applied voltage, the operating temperature environment and the loading conditions of the chip affect its performance.

For logic switching applications, the transistors of a chip are typically configured as inverter and buffer circuits. An inverter "inverts" the logic sense of a binary signal, while a buffer is used merely for signal amplification; it does not produce any particular logic function since the binary value of the output is the same as the binary value of the input. However, buffering of low-level signals with semiconductor chips to develop high-level digital pulse signals is very susceptible to propagation delay variations due to process, voltage, temperature and loading (PVTL) variations. Differences in propagation delay between clock "buffer" chips in a system directly translate into skew. Removing propagation delay, and thus delay differences, is not physically possible; however, adding delay is.

The problem of clock skew is addressed partly by employing a system clock source and distributing the clock signals to the respective modules. The distribution is accomplished in a manner such that the clock signals arrive essentially simultaneously at the modules. However, in each module the incoming clock signals must be processed, i.e., shaped, amplified and regenerated into multiple copies, before use by various circuits on the module. Such processing necessarily delays the signals; the delays can be expected to vary from module to module because of PVTL variations. These variations contribute significantly to clock skew and the present invention is directed to the reduction of the skew.

A particular approach to reducing process, voltage and temperature (PVT) inspired clock skew is disclosed in an article titled, VLSI PERFORMANCE COMPENSATION FOR OFF-CHIP DRIVERS AND CLOCK GENERATION, by Dennis T. Cox et al. of IBM from *Proceedings of IEEE* 1989 *Custom Integrated Circuits Conference*, pp. 14.3.1-14.3.4. In general, the disclosed skew regulator uses an external precision clock to develop an accurate pulse. This pulse is introduced into a tapped delay line (five "odd" taps from a 287-inverter chain). The taps are monitored by latches which are closed at the falling edge of the pulse. A fast PVT condition causes the pulse to pass more of the taps, resulting in the storage of more zeros (widely spaced odd taps are used) in a PVT measurement latch, than a slow PVT condition. The resulting PVT measurement "word" is used to select a tap on an input clock buffer delay line to add propagation delay to fast chips and minimize delay on slow chips.

The above-described approach requires a separate clock source to operate a programmable sense element (PSE). The skew regulator is implemented or)-every device it services in the system. Tap selection on the measurement delay line is tailored to a specific process and the taps are not evenly spaced. The PSE stage measurement delay chain and the 5-stage clock delay line are not sized the same and, generally, do not track identically with all process variations. Specifically, relative, as opposed to absolute, measurement of clock propagation delay is performed. Other prior attempts to control skew of an output clock signal with an input signal typically employ a phase locked loop (PLL). A PLL is a device which continually strives to track the frequency of an input signal. The frequency of a voltage controlled oscillator (VCO) signal is compared with that of the input signal using a phase comparator that produces an error voltage proportional to their frequency difference. This error voltage is used to control the frequency of the VCO. Specifically, filtering of the error voltage involves a trade-off determination between acquisition time, i.e., the time it takes to "lock" the frequency of the VCO to an average frequency of the input signal, and jitter, i.e., phase noise.

A problem with the PLL approach is that jitter is a major contributor to skew. In addition, replication of input and output circuitry in the PLL feedback path is needed for accurate phase tracking, while separate loops are required for each clock phase. Moreover, each PLL in the system contributes its own phase-offset error depending on VCO, filter and phase detector PVTL variations.

Therefore, it is among the objects of the invention to provide an "absolute" delay regulation technique that reduces clock skew.

Another object of the invention is to minimize the number of clock lines on a system backplane.

Yet another object of the present invention is to redistribute multiple copies of low skew clock signals to circuitry on a module.

Still another object of the invention is to provide as much time as possible during a limited bus cycle period to transmit data across a high-speed, bidirectional synchronous bus.

SUMMARY OF THE INVENTION

Briefly, an "absolute" delay regulator constructed in accordance with the invention performs a precise measurement of the propagation delay of a processed clock signal and adjusts that delay so as to maintain a fixed-phase relationship with an input clock signal. The delay regulator is contained on a single clock repeater chip that is located on each module of a computer system and functions as the final link in a high-speed, clock distribution system. Each chip provides an interface between the globally-distributed (system) input clock signal and corresponding locally-distributed (module) output clock signals used to control circuitry on each module containing the chip.

Specifically, each repeater chip receives an input clock signal from a system clock generator, amplifies the signal and creates multiple copies of it for re-distribution to circuitry on the module. Propagation delays resulting from PVTL variations among the repeater chips of the system are corrected within each chip by a delay regulator that adds controlled amounts of delay to the output clock signals. The delay regulator preferably causes the repeater chip to delay the output clock signals by an integral number of clock cycles. Delay is accomplished by passing the input clock signal through a tapped delay line and selecting a tap corresponding to the amount of delay required. Selection of the appropriate tap is determined, in part, by measuring the overall delay of an internal clock path of the repeater chip.

Delay measurement is performed using a logic circuit that replicates the internal path delay of the repeater chip. The logic, i.e., a "replica loop", precisely replicates the internal path and external loading, including input and output buffers, of the chip. The output of the replica loop drives a delay line whose tapped outputs provide an "absolute" delay measurement. Results of the measurement are decoded and used to select an appropriate tap to another delay line used to insert a desired amount of delay to the output clock signals.

In another aspect of the invention, a remote sensing circuit within the replica loop replicates the internal clock distribution path of circuitry to which the output clock signals are distributed. This allows the clock repeater chip to regulate delay originating from both itself and, for example, its associated bus interface chips.

In yet another aspect of the invention, an auto-ranging feature is provided to extend the frequency range of delay regulation within the repeater chip. Auto-ranging is based on an overflow condition associated with a measurement delay circuit that typically occurs at low clock frequencies.

In still yet another aspect of the invention, a fine-grain enhancement circuit of the tapped delay line provides significant resolution improvement to the absolute delay regulator. The tapped delay line preferably comprises a string of inverters. In order to maintain correct polarity within the delay line, taps are generally placed only at the output of inverter pairs. Hence, the resolution of the system is limited to an inverter pair, i.e., a unit of measurement. The fine-grain enhancement circuit increases this resolution by allowing taps at each inverter output.

In still another aspect of the invention, a non-pulse time reference (NPTR) technique generates an accurate measurement reference period required for proper delay regulation. The NPTR circuit establishes a measurement reference by measuring the time between successive "like" edges of two concurrent, internally-generated pulses.

Therefore, in accordance with the purpose of the invention as embodied and broadly described herein, a delay regulator is provided for maintaining a fixed-phase relationship between an input clock signal and a processed output clock signal. The delay regulator is contained on a clock repeater chip that includes an internal clock path configured to receive the input clock signal and distribute the processed output clock signal. The delay regulator comprises: means for precisely replicating a propagation delay of the internal clock path and external load of the repeater chip, means for measuring the replicated propagation delay and means for compensating for the replicated propagation delay by adding a controlled amount of delay to the processed output clock signal. As a result, the processed output clock signal is in-phase with the input clock signal of the chip.

An advantage of the invention is that the regulation circuit is fully contained within the clock repeater chip and requires no external control signals. Thus, it accurately replicates the delays in the clock path circuits on the chip because it is subject to the same process, voltage, temperature and loading conditions as the latter circuits.

BRIEF DESCRIPTION OF THE DRAWINGS

The above and further advantages of the invention may be better understood by referring to the following description in conjunction with the accompanying drawings, in which:

FIG. 7 is a diagram of an inverter-pair configuration of a tapped delay line within the clock delay path of FIG. 6;

FIG. 8 is a block diagram of a clock path control logic unit of the delay regulator;

DETAILED DESCRIPTION OF ILLUSTRATIVE EMBODIMENTS

Figure 1:
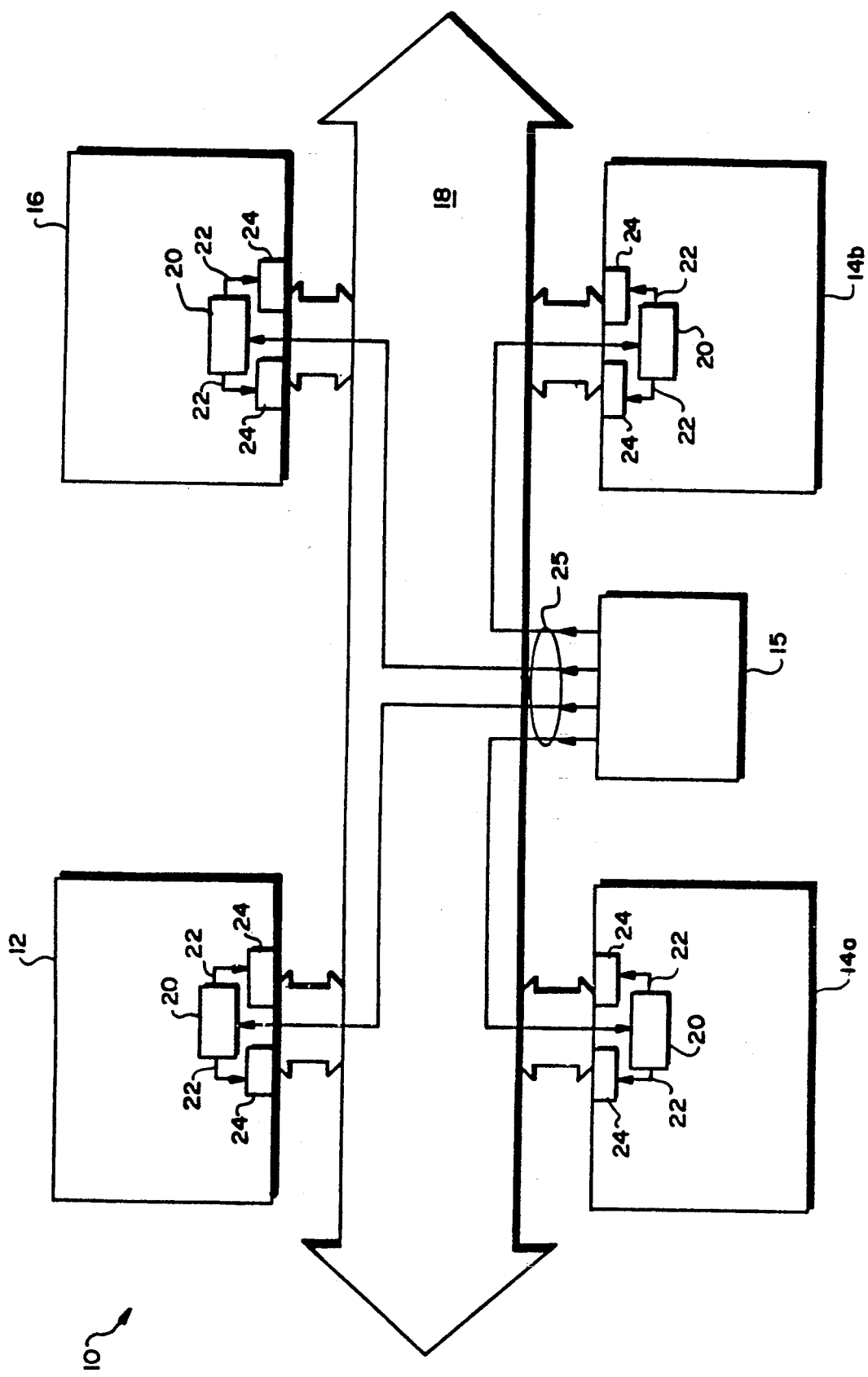
FIG. 1 is a block diagram of a computer system including modules having a clock repeater chip for receiving a globally distributed system clock signal.

Referring to FIG. 1, a synchronous computer system 10 typically includes a central processing unit module 12, main memory modules 14a, 14b and an input/output unit module 16 interconnected by a high-speed, bidirectional synchronous bus 18. A clock module 15 generates a system clock signal to synchronize the operations of the computer system. The system clock signal is globally-distributed via separate, generally radial, unidirectional clock lines 25 of the synchronous bus 18 to each module of the computer 10.

A clock repeater chip 20 located on each module receives the distributed system clock signal as an input signal. The repeater chip 20 is preferably a VLSI CMOS custom integrated circuit chip functionally configured to shape and amplify the input signal prior to generating multiple copies of it. The resulting processed output clock signals are thereafter distributed to circuitry, e.g., bus interface circuitry 24, on each module. Preferably, the chip 20 converts controlled-edge, system clock signals with low-level voltages to a 0-5 v, 50% duty cycle digital pulse required by the bus interface chips 24.

Any number of clock signals may be "skew-regulated" by the repeater chip 20 by including additional delay regulation circuitry, as further described below. In general, the clock signals may have phases different than the system clock signal. For example, an embodiment of the present invention may support two clock channels. The second channel supports delay regulation and distribution of a second clock signal having the same frequency as the system clock signal, but locked in phase quadrature.

Figure 2:
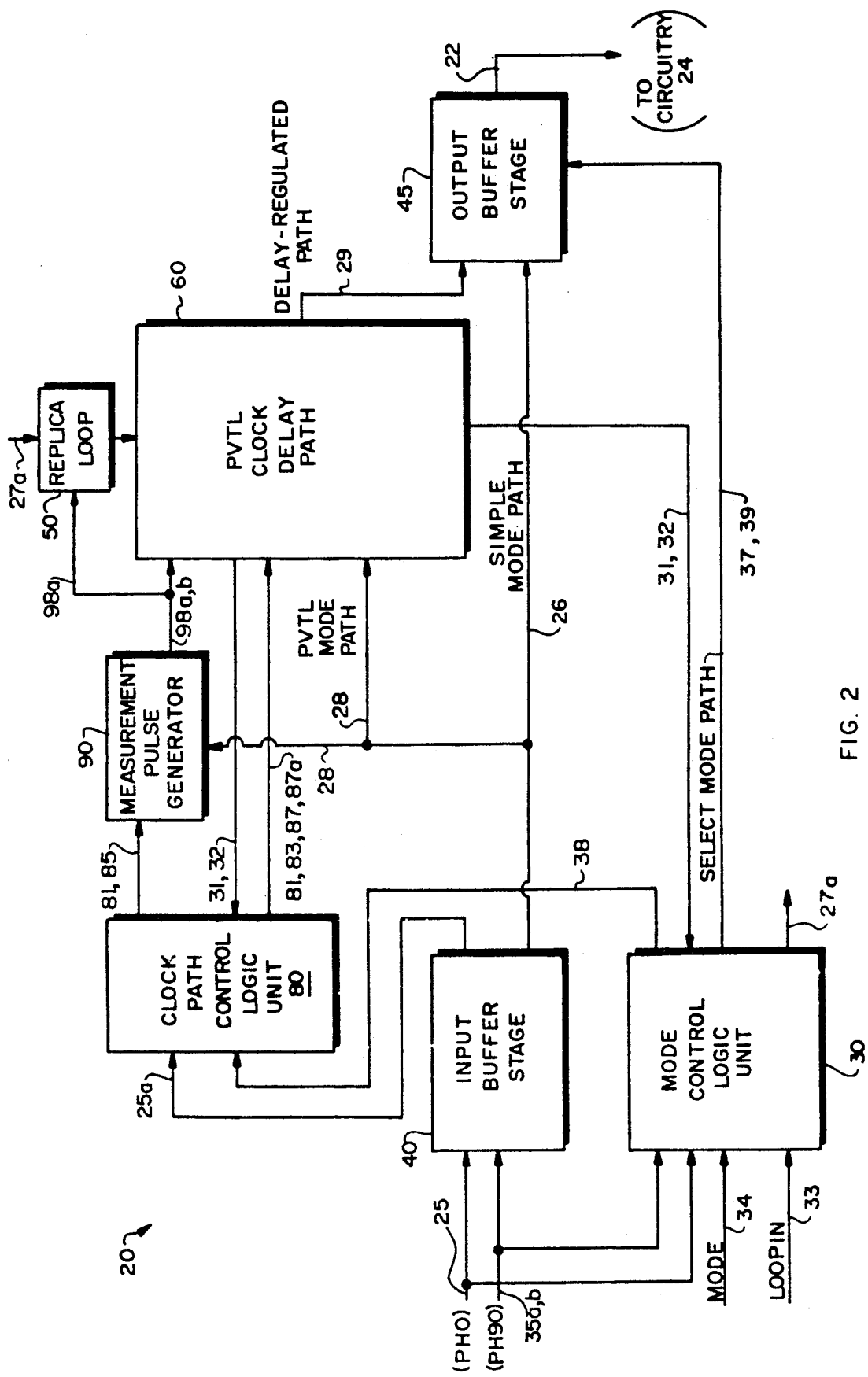
FIG. 2 is a block diagram of the clock repeater chip including a delay regulator circuit in accordance with the invention.

FIG. 2 is a block diagram of a clock repeater chip 20 including a delay regulator circuit. The system clock signal, PH0 on line 25, and the second clock signal, PH90 on differential input lines 35a,b,are received at an input "buffer" stage 40, where they are shaped and amplified. The clock signals may then be driven directly, i.e., "simple mode path" via line 26, to an output buffer stage 45 where they are regenerated into multiple copies for distribution to circuitry 24 on the module. As an alternative, the clock signals may be driven through a clock delay path 60 (FIG. 2) via a "process, voltage, temperature and loading (PVTL) mode path" 28 that is used to delay the signals prior to delivery to the output buffer stage 45.

Figure 3:
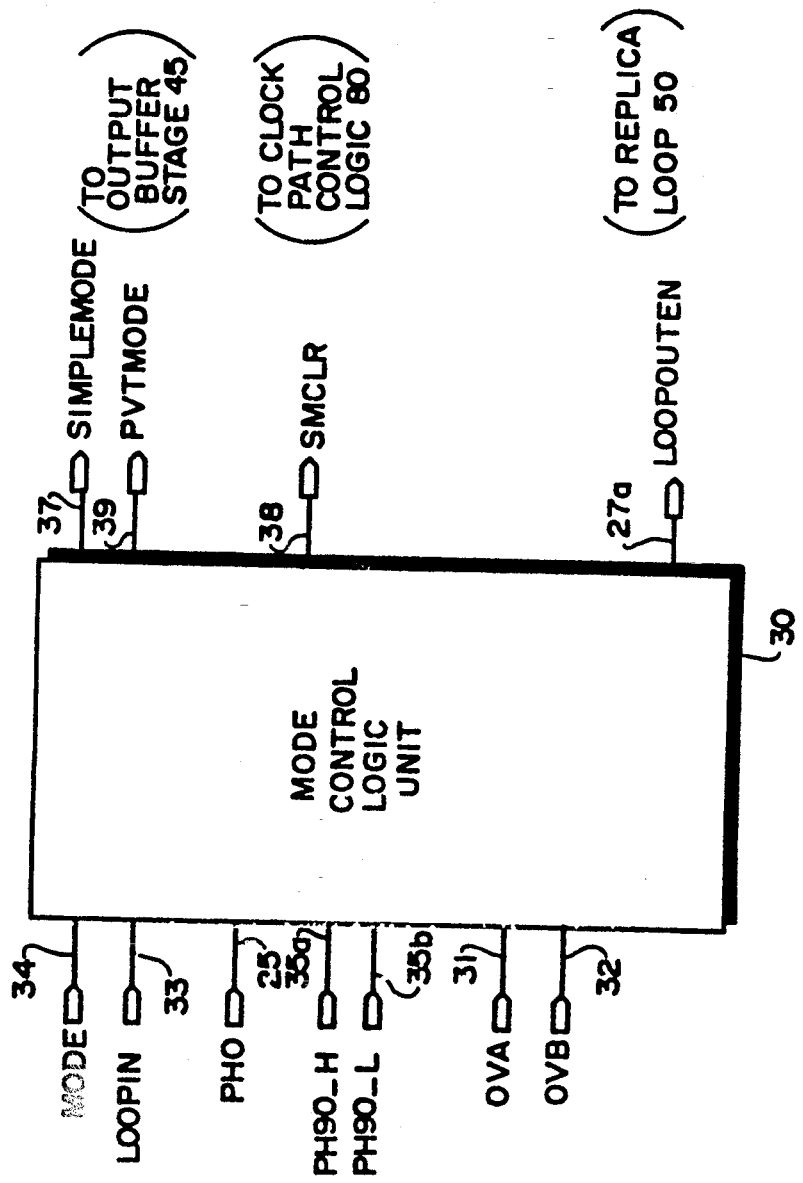
FIG. 3 is a block diagram of a mode control logic unit of the repeater chip including a truth table depicting the relationship between input and output signals of the mode control unit.

Selection of simple or PVTL mode is determined by a mode control logic unit 30. A truth table of FIG. 3 depicts the relationship between input and output signals of the unit 30. It will be understood to those skilled in the art that the table can be used to implement logic circuitry for the mode control unit 30. Simple mode allows the clock repeater chip 20 to operate at relatively low frequencies; this is advantageous when low speed, computer system testing is performed. A LOOPIN signal on line 33 and a MODE signal on line 34 are used to select the simple mode path of the output buffer stage 45 via a SIMPLEMODE signal on line 37; PVTL mode is selected via the PVTMODE signal on line 39. Furthermore, the LOOPIN pin 33, which is shared between the mode control unit 30 and an input to the clock delay path 60, is used to enable a "test" mode of operation. When in test mode, the PH90 clock signal channel 35 is not used; therefore its differential input pins, i.e., PH90_H on line 35a and PH90_L on line 35b, are used to select various sub-testing modes of operation. Here, the PH0 system clock signal on line 25 is used to activate the logic circuitry used for each sub-mode.

Figure 5:
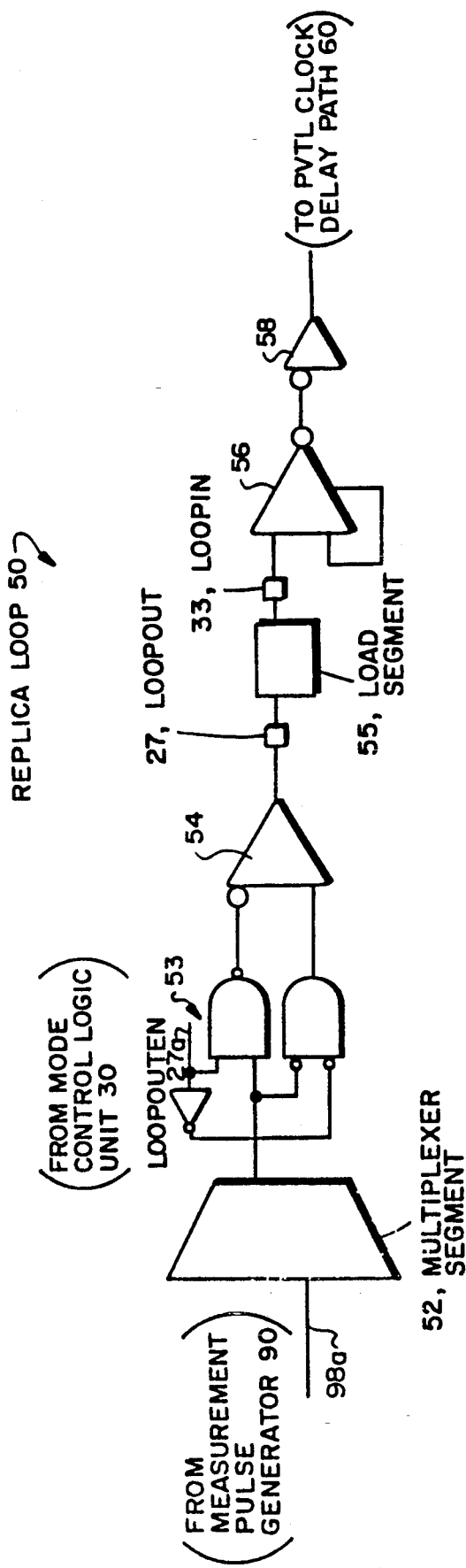
FIG. 5 is a block diagram of a replica loop of the delay regulator.
Figure 14:
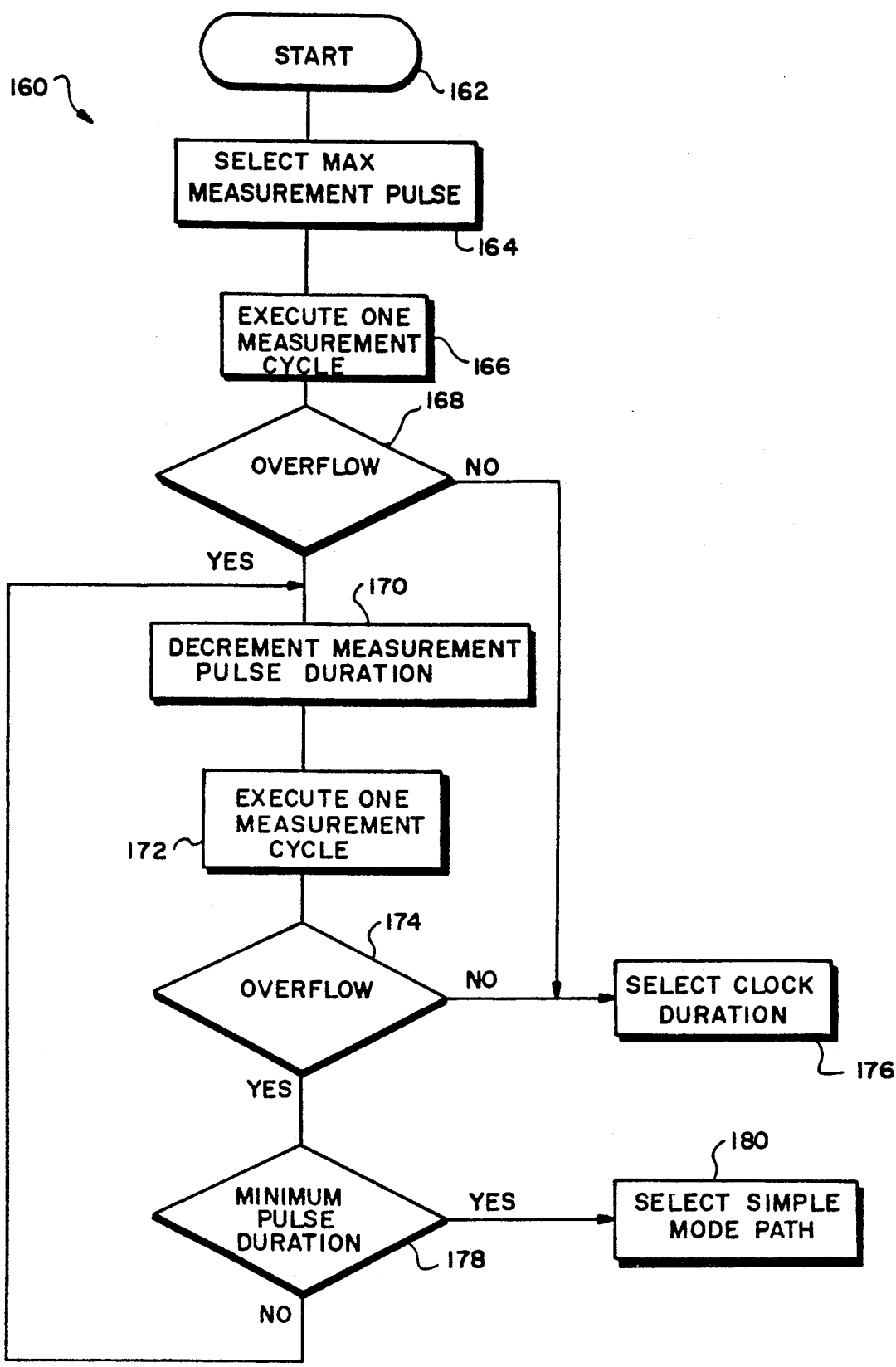
FIG. 14 is a flow diagram setting forth the sequence of operations during auto-ranging in accordance with the invention.

Overflow input signals, OVA on line 31 and OVB on line 32, are used in connection with an auto-ranging feature of the invention; this feature extends the frequency range of the clock repeater chip as described further herein in connection with FIG. 14. A state machine clear signal SMCLR on line 38 is used to clear a sequential logic circuit of a clock path control unit 80 (FIG. 8), while a signal LOOPOUTEN on line 27a enables certain logic circuitry of a replica loop circuit 50 (FIG. 5).

Figure 4:
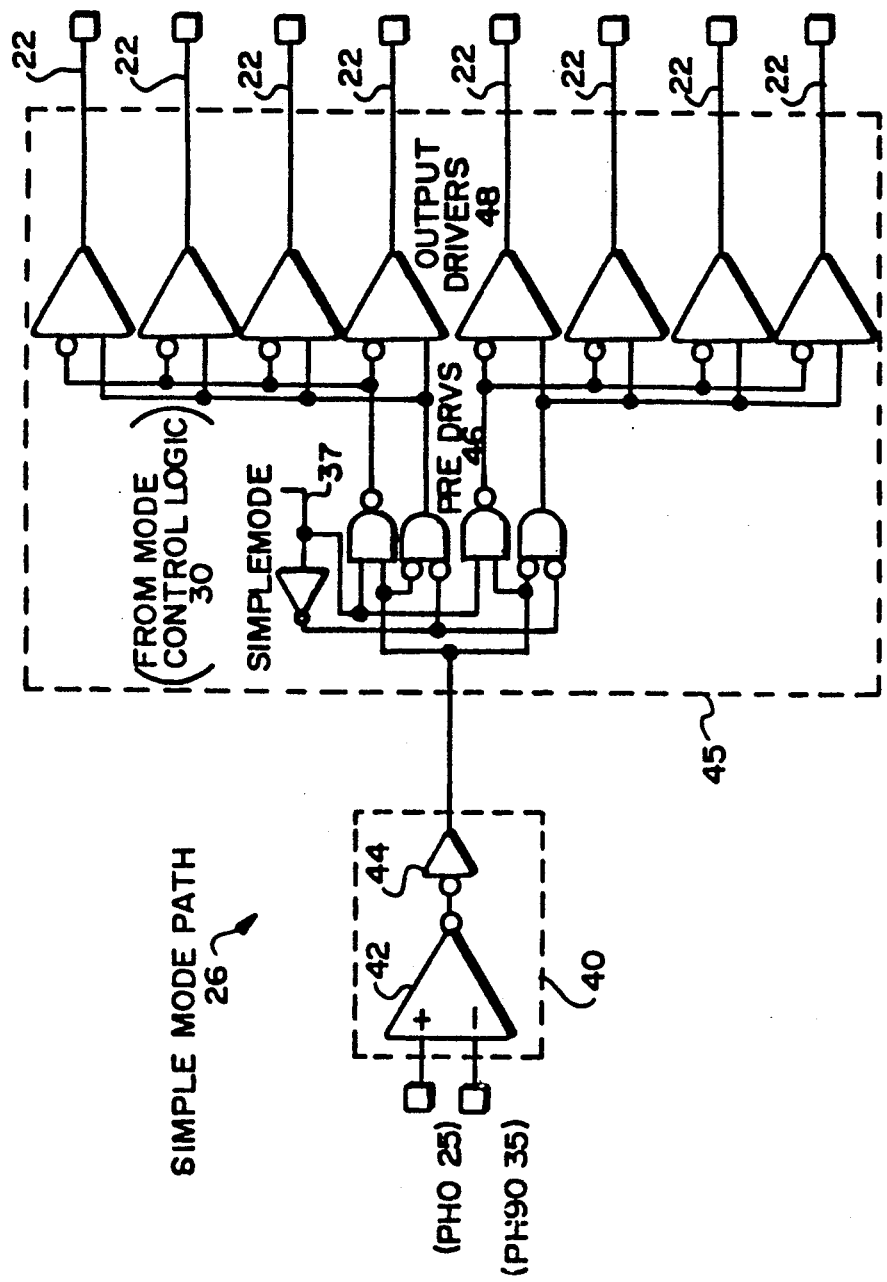
FIG. 4 is a diagram of a simple mode clock path of the repeater chip of FIG. 2.

FIG. 4 is a diagram of the simple mode path 26. The input buffer stage 40 comprises differential and post-amplifier circuitry. Specifically, a differential amplifier 42 receives a low-level input signal, i.e., either square or limited-edge rate wave, and produces a "shaped", amplified square wave pulse having approximately the desired amplitude. The post-amplifier 44 "cleans-up" the differential amplifier output signal; that is, it functions as a level-shifter to deliver a full amplitude signal to the output buffer stage 45. The post-amplifier 44 also ensures the duty cycle of the signal is correct and in phase with the input signal PH0 on line 25 (or PH90 on line 35).

The output buffer stage 45 comprises a predriver section 46 including AND and NAND gate circuitry, and an output driver section 48 including a plurality of tri-state drivers. The output buffer section 45 is divided into two segments to accomodate the simple mode 26 and the PVTL mode 28 paths. For purposes of clarity, only the simple mode segment is shown. Functionally, the predrivers 46 are enabled by the SIMPLEMODE signal on line 37 generated by the mode control logic unit 30. The predrivers 37, in turn, generate multiple copies of the clock signal, while the output drivers 48 distribute these processed signals to circuitry on the module.

Referring again to FIG. 2, the PVTL mode path 28 enables measurement and delay compensation for the input signal. An absolute delay regulator circuit operates in a cyclical fashion by periodically measuring the intrinsic delay of a clock path, including the PVTL clock delay path 60, on the chip 20. After a measurement, one of two delay adjusting units within the clock delay path 60 is updated, while the other delay unit determines the actual delay of the chip 20 from a previous measurement cycle. Specifically, the regulator updates a delay unit by adding a controlled amount of delay to the input clock signal propagating through a delay line so that the output clock signal maintains a fixed-phase relationship with the input signal.

In accordance with the teachings set forth herein, the invention maintains a fixed-phase relationship among all clock signals emanating from repeater chips of the computer system. Because of the global-clock distribution arrangement employed by the computer, nearly all skew-producing buffering in the system is embedded in the repeater chips 20. The fixed-phase relationship between input and output clock signals is maintained by adding a delay that provides an integer number of clock cycles of total delay to each input clock signal passing through the PVTL clock delay path 60. Since "in-phase" digital clock signals are exact images of each other, the waveforms of an undelayed clock signal and a clock signal delayed by an integer number of in-phase cycles are identical. The amount of added delay is based upon the intrinsic delay characteristics of each chip.

The PVTL clock delay path 60 on the repeater chip 20 includes the logic circuitry required to measure and compensate for the intrinic delay of the chip. A "replica loop" circuit 50 simulates the logic and associated propagation delay of the clock path, as described further herein. An external loading network 55, coupled between LOOPIN on line 33 and LOOPOUT on line 27, simulates the loading of printed circuit board etch traces connected to the outputs of chip 20, leading to external loads. A pulse generator 90 supplies a precise measurement pulse needed to operate the clock delay path 60 and replica loop 50, while a clock path control logic unit 80 provides the necessary timing signals to perform delay regulation on the chip 20.

In general, the regulator circuit records the amount of "time" it takes a measurement pulse to propagate through the replica loop circuitry 50; it then "subtracts" this time from a chosen integer number of clock cycles that the clock signal will be delayed. The number of inserted delay cycles is a function of the operating frequency range of the regulator as determined by the clock path control logic 80. Measurement and substraction are performed at once, and the results are stored in a register within the clock delay path 60.

Figure 6:
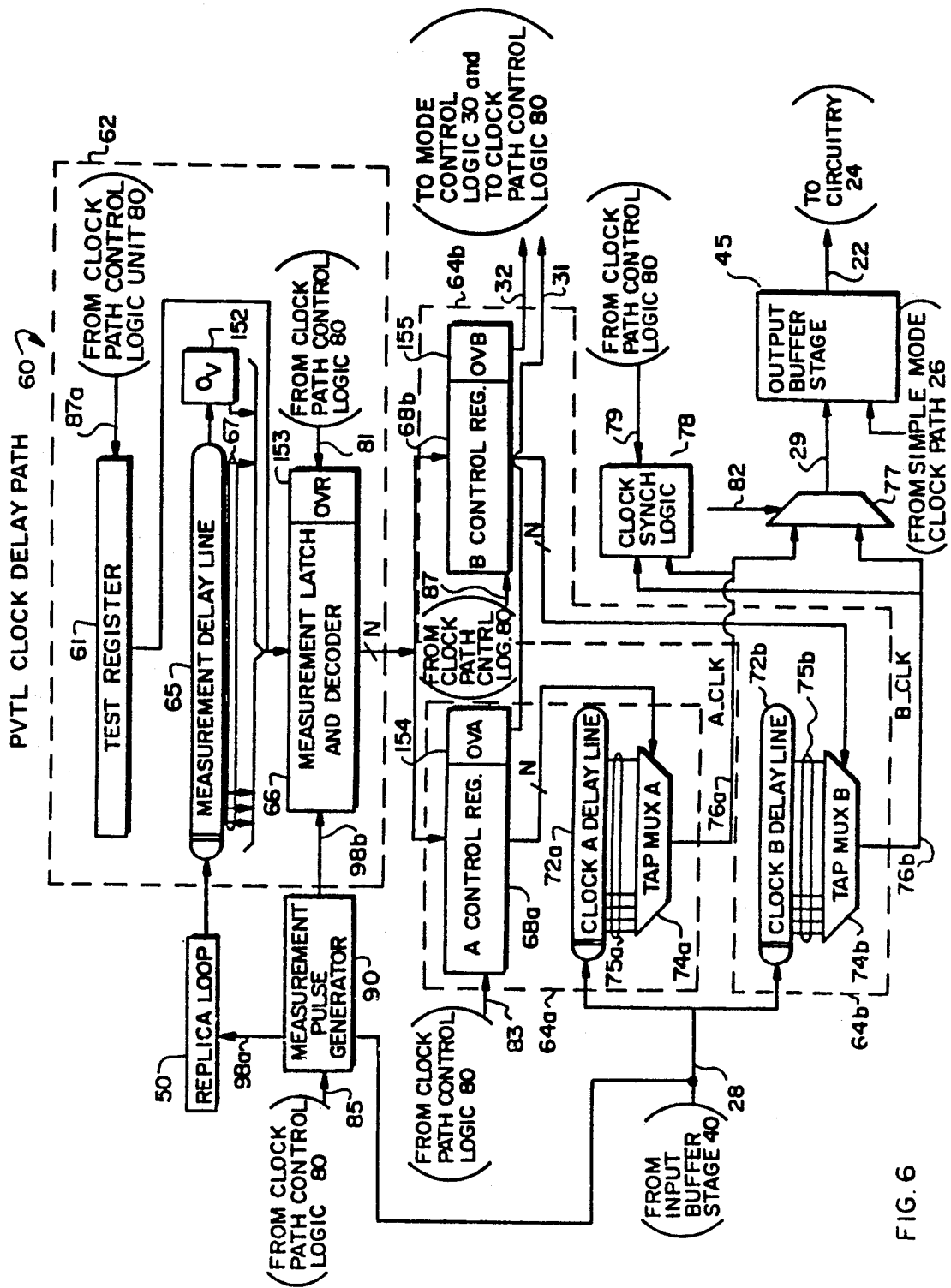
FIG. 6 is a block diagram of a clock delay path of the delay regulator.

Thereafter, a clock signal is routed through delay lines of the clock delay path's delay adjusting units (see FIG. 6). The delay lines are configured to delay the clock signal by the following time difference:

$$NT - D_{replica}$$

where,
N = an integer greater than or equal to one,
T = clock cycle period, and
$D_{replica}$ = the intrinsic chip delay, i.e., a function of PVTL variations for a particular chip.

In an embodiment of the invention, a system clock cycle period T is preferably 20 nanoseconds (ns) and a measurement pulse duration N is 2 cycles, i.e., 40 ns. For an alternate embodiment, the system clock cycle period is preferably 40 ns and the measurement pulse duration is 1 cycle or 40 ns. Delay compensation is performed during a PVTL delay regulation cycle, which preferably occurs every 100 cycles of the system clock signal. At this rate of compensation, the PVTL variations, e.g., temperature, of the chip are very small; hence, the change in chip propagation delay is small and a small amount of compensation is required.

Input clock signals processed by the repeater chip 20 experience an intrinsic chip delay ($D_{int}$) in addition to the delay programmed into the clock delay lines of the chip:

$$D_{int} + NT - D_{replica}$$

Assuming $D_{replica}$ closely matches $D_{int}$, the resulting delay is approximately NT and there is no apparent skew between the input and output clock signals; in fact, the output clock signals of the repeater chip exactly track the system input clock signal.

As noted, the replica loop 50 accurately simulates the internal signal path and external loading, including the input and output buffers, of the clock repeater chip 20. This allows measurement of and correction for the "absolute" value of intrinsic propagation delay of the chip, which is a fundamental distinction over prior techniques. FIG. 5 depicts a block diagram of the replica loop 50 of the delay regulator. Logic circuitry within the replica loop includes (i) a select and clock delay multiplexer segment 52; (ii) a preamplifier segment 53; (iii) an output driver segment 54; (iv) an external loading network segment 55 that is typically capacitive in nature; (v) a differential amplifier segment 56; and (vi) a post-amplifier segment 58. The logic 50 specifically replicates transistor sizes, layout parasitics, and capacitive loading in the clock path of the chip 20.

A block diagram of the PVTL clock delay path 60 of the delay regulator is depicted in FIG. 6. The clock delay path 60 is preferably one hundred and forty-four bits wide and generally includes a measurement circuit 62 and a pair, i.e., A and B, of delay adjusting units 64a, 64b, generally designated 64. A measurement signal propagates through the replica loop 50 and into a tapped measurement delay line 65 where an "absolute" measurement of the chip intrinsic propagation delay is provided in conjunction with the measurement pulse generator 90 and the measurement latch 66, as described herein below. The tapped delay line 65 preferably comprises a string of inverters. To maintain correct polarity from the delay line, the taps are placed at the outputs of inverter-pairs. FIG. 7 illustrates an inverter-pair configuration 70 of the delay line 65. Specifically, the delay resolution of the system is between 0 and the delay of one inverter pair; in other words, the resolution is an inverter pair 70, which is a unit of measurement granularity.

In general, PVTL variations between chips 20 will cause a unit of measurement to differ between repeater chips of the computer system 10. For example, an inverter pair delay time may change over time on a particular chip if the temperature varies. Maximum granularity error is predicated on the slowest chip 20 in the system, i.e., the chip having the longest measurement delay increment. However, the granularity error is single-sided and overlapping, i.e., the inverter-pair granularity only manifests as a measured unit of delay "after" the pulse propagates through the pair. A measurement occuring before propagation through the inverter pair 70 results in the output clock signal being between, at most, an "early" delay unit to exactly coincident. Accordingly, system skew attributable to the repeater chips 20 is less than or equal to a slow chip's inverter pair delay. Since delay lines used in the clock delay path 60 are the exact image, i.e., a replication, of the delay line 65 used in the replica loop 50, the same delay is replicated during delay regulation for each chip and the resulting output clock signals are in phase with the input signals.

Referring again to FIG. 6, the results of the measurement are then loaded into a measurement latch 66 where they are decoded by an internal decoder circuit. In a preferred embodiment of the invention, the decoder circuit (not shown) employs a conventional Johnson counter-style decoder configuration. The decoded signals may thereafter be loaded into control registers 68a, 68b, generally designated 68, of the A and B delay adjusting units 64. In addition to the control registers, each delay unit 64 includes a clock delay line and a tap select multiplexer. The clock delay lines 72a, 72b, generally designated 72, receive a clock signal on line 28 from the input buffer stage 40. The use of two delay adjusting units 64, i.e., "double-buffering", allows the regulator to adjust the clock signal in one of the units by adding the desired delay, while the other unit still compensates for the previously-measured intrinic delay of chip. This technique contributes, in part, to a non-interrupted output clock signal.

The output of each delay control register 68 enables respective A and B tap select multiplexers 74a, 74b, generally designated 74, to select an appropriate tap from its associated clock delay line 72. As with the measurement delay line 65 described previously, the A and B delay lines 72 preferably comprise a string of inverters having taps at inverter-pair outputs. In a preferred embodiment of the invention, the delay lines 65 and 72 employ two hundred and eighty-eight inverters or one hundred and forty-four inverter-pairs 70 with one hundred and forty-four taps 67 and 75a, 75b, respectively. A selected tap inserts a desired amount of delay to the input clock signal.

Each tap multiplexer 74 has an input for every tap, generally designated 75, in the delay line 72, e.g., one hundred and forty-four inputs, and one output. The multiplexer 74 is preferably implemented as an array of gates in a generally conventional "OR tree" configuration. The multiplexer 74 selects one of the one hundred and forty-four taps 75 from the clock delay line 72, which, in turn, inserts the proper amount of delay to the clock signal on line 28 driven into the clock delay lines.

The resulting output clock signals, i.e., A_CLK on line 76a and B_CLK on line 76b, from the multiplexers 74 are thereafter coupled to a two-to-one clock delay multiplexer 77 that is enabled by clock synchronization logic 78. Here, one of the clock signals is selected and forwarded via a delay-regulated clock path 29 to the output buffer stage 45 for distribution to circuitry 24 on the module. Specifically, an A/B select signal, AB_SELECT, on line 79 provided by the clock path control logic 80 is retimed by the synchronization logic 78 to select the updated clock signal. The clock synchronization logic 78 ensures that both clock signals are in a low state before the delay multiplexer 77 is enabled by a selection signal on line 82. This, in turn, ensures that the output clock signal 22 from the repeater chip 20 does not "glitch" when the clock delay multiplexer 77 switches from one input signal to the other. Synchronization logic circuitry 78 used to produce a retimed selection signal 82 is disclosed in a patent application titled, UPDATE SYNCHRONIZER, by Iknaian et al. filed herewith, which application is expressly incorporated by reference as though fully set forth herein.

FIG. 8 is a block diagram of the clock path control logic unit 80, which preferably comprises registers and combinational logic configured to produce a sequential logic circuit, e.g., a "state machine". In an embodiment of the clock path control logic 80, the state machine comprises two cascaded, 5-bit Johnson counters 84a, 84b coupled to a decoder and synchronizer unit 86. The state machine, herein also referred to at 80, controls the sequencing of operations during a PVTL delay regulation cycle by generating timing signals used in the operation of the PVTL clock delay path 60. Specifically, a cycle of operation is as follows:

1. State 0: Clear measurement latch;
2. State 1: Generate measurement pulse, freeze measurement result in measurement latch and toggle clock delay control register selection via AB_SELECT to select B delay control register (and clock B delay line) for delaying clock signal;
3. State 2: Write measurement word (stored in measurement latch) after decoding into A delay control register. The tap on clock A delay line is set to reflect the recent measurement. Clock B delay line (one for each clock phase) still controls clock delay;
4. State 3: Clear measurement latch;
5. State 4: Generate measurement pulse, freeze result in measurement latch and toggle clock delay control register selection via AB_SELECT to select A delay control register (and clock A delay line) for delaying clock;
6. State 5: Write measurement word (stored in measurement latch) after decoding into B delay control register. The tap on clock B delay line is set to reflect the recent measurement. Clock A delay line (one for each clock phase) still controls clock delay;
7. State 6: Spare—not used;
8. State 7: Spare—not used;
9. State 8: Clear test register and "self-clean" the control logic state machine;
10. State 9: Spare—not used;
11. Return to State 0.

In a preferred embodiment of the invention, each state time is longer than a measurement pulse, e.g., ten clock circles per state time; accordingly, the absolute PVTL delay regulator performs a complete A/B control register measurement and update cycle every 100 system (PH0) clock cycles. Operation of the PVTL delay regulator will now be described with reference to the delay regulation cycle and FIGS. 1-8. At the start of delay regulation, a measurement enable signal, MEAS_EN, on line 85 is generated by the clock path control logic 80 as a result of the logical "ORing." of states 1 and 4 above. The MEAS_EN signal triggers the pulse generator 90, which produces a measurement pulse of M clock cycles in duration that is transmitted to the replica loop 50 on line 98a and to the measurement latch 66 on line 98b. Specifically, the leading edge of the pulse propagates through the replica loop 50 and into the measurement delay line 65; meanwhile, the leading edge of the pulse also "opens" the measurement latch 66. In contrast, the trailing edge of the pulse "closes" the measurement latch 66, taking a "snap shot" of, i.e., revealing, the progress of the leading edge of the pulse as it traverses the inverter-pairs of the delay line 65 during the measurement interval.

The resulting content of the measurement latch 66 is a "delay word" having a series of logic "1" bits, indicating the leading-edge of the pulse passed through inverter-pairs 70 of the measurement delay line 65, followed by logic "0" bits, indicating that the pulse did not reach a respective inverter-pair delay unit during the measurement interval:

111111111111 ... 111000 ... 00

Figure 9:
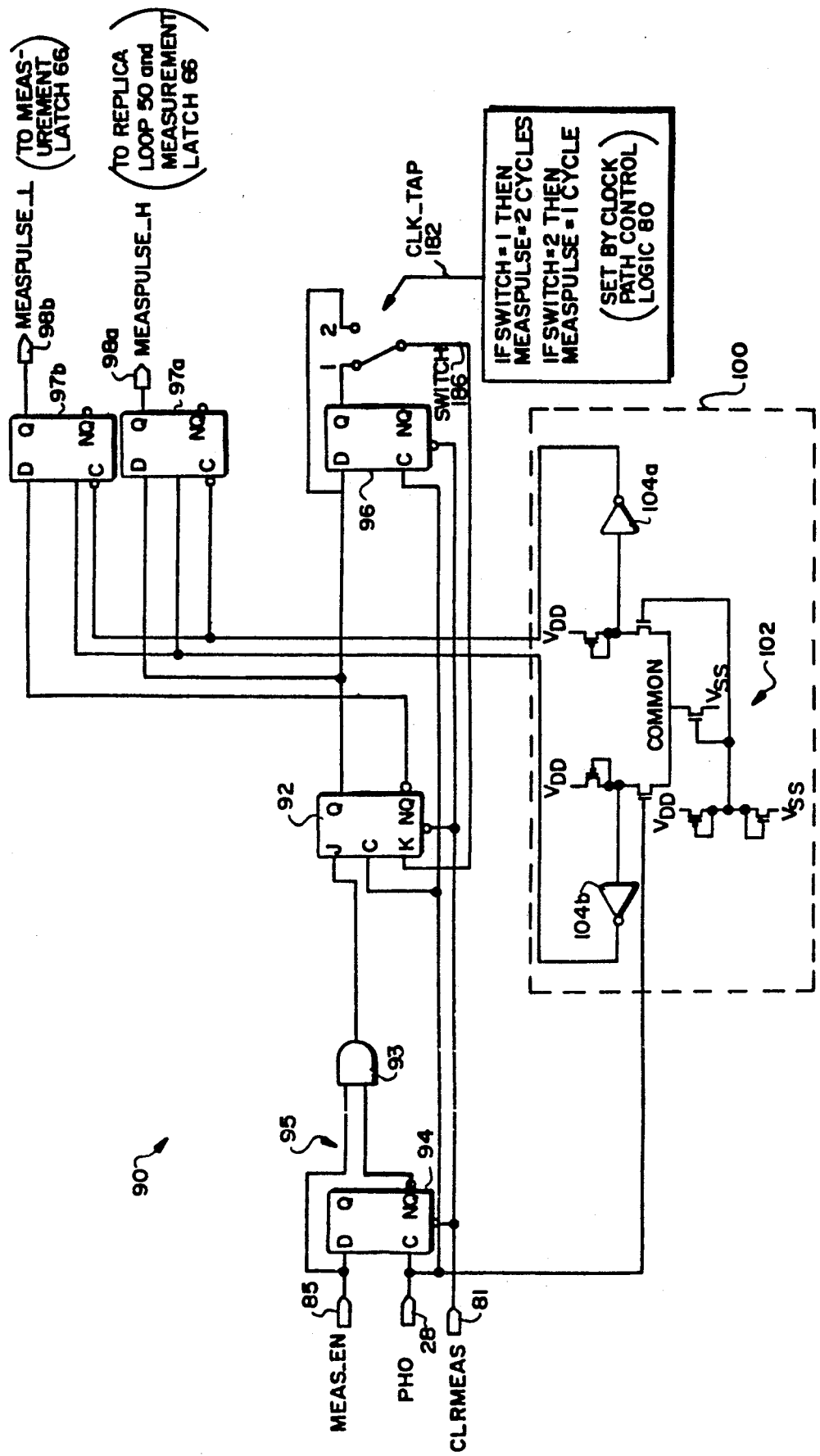
FIG. 9 is a diagram of a measurement pulse generator of the delay regulator.

The delay word represents the difference between the chosen number of delay cycles M added to the clock signal and the repeater chip's intrinsic propagation delay. It should be noted that the amount of time the latch 66 remains open is significant to overall delay regulation. This, in turn, depends upon the accuracy in generating the measurement pulses driven through the replica loop 50 and driven to the latch 66. An embodiment of the measurement pulse generator 90 is depicted in FIG. 9. In general, the generator employs a JK flip-flop device 92 that is set by an enable signal, MEAS_EN on line 85, generated by the clock path control logic 80 and conditioned by a digital differentiator 95, i.e., an AND gate circuit 93 controlled by a first D-type flip-flop device 94, to identify only its leading edge. The JK device 92 and a second D-type device 96 are configured as a 2-bit shift register to produce data input signals to two measurement pulse D-type flip-flops 97a, 97b. A driver circuit 100 including a differential amplifier 102 with inverted outputs 104a, 104b is used to create complementary, zero-skew clock signals to control the measurement pulse flip-flops 97a,b of the generator 90.

Referring again to FIGS. 1-8, the decoder circuit (not shown) within the measurement latch 66 decodes the delay word and translates it into a "tap select word":

| | |
|---|---|
| 111111111111...111000.....00 | measurement word |
| 111111111111...110111.....11 | tap select word (low asserted) |

The tap select word is then "double-buffered" in the A and B clock delay control registers 68 as described above in the state description. The A and B control registers 68 are controlled by a WRA timing signal on line 83 and a WRB timing signal on line 87, respectively, both of which are generated by the clock path control logic 80. As noted, the control registers 68, located within respective A and B delay units 64, function in a manner such that one delays, i.e., "controls", the clock signal to be distributed to the module, while the other is "programmed" by the measurement process. In accordance with the states 1 and 2 of regulation cycle set forth above, the B delay unit 64b initially controls the clock signal, while the A delay unit 64a programs a recent measurement.

The tap select word in the B delay register 68b thus enables its respective tap select multiplexer 74b to select an appropriate tap of the clock B delay line 72b as an output signal from the mulitplexer. Specifically, the OR gates (not shown) of the tap multiplexer 74 are enabled or disabled by bits in the tap select word and a "tap select line", corresponding to the "1/0" transition point of the tap select word, is asserted; this inserts the desired amount of delay into the output clock signal, i.e., B_CLK. The clock delay multiplexer 77 then selects one of the output A_CLK and B_CLK signals in an orderly manner. Thereafter, the roles of the A and B delay units are switched, e.g., the B delay unit 64b is updated, while the A unit 64a determines the delay introduced by the chip 20.

A test register 61 (see state 8) allows for manufacture testing of the PVTL clock delay path 60 of the repeater chip 20 without subjecting the chip to severe environmental conditions. An apparatus and method of testing the clock delay path is described in patent application titled, METHOD AND APPARATUS FOR COMPLETE FUNCTIONAL TESTING OF A COMPLEX SIGNAL PATH OF A SEMICONDUCTOR CHIP, by Iknaian et al. filed herewith, which application is expressly incorporated by reference as though fully set forth herein.

Handling Multiple Clock Phases

As noted, only one clock signal is needed to operate the delay regulator; however, any number of signals may be delay-regulated by including additional delay units. The signals may include clock signals having phases and periods different than the system clock signal. Specifically, replication of the clock delay circuitry for the clock delay path 60, e.g., A and B delay lines 72, tap multiplexers 74, clock delay multiplexer 77 and output buffer circuitry 45, is needed for each additional signal. For purposes of in-phase operation, the integral number of clock cycles of delay provided by the absolute PVTL delay regulator implementation should be acceptable to circuitry associated with the additional signals.

Remote Sensing

Figure 10:
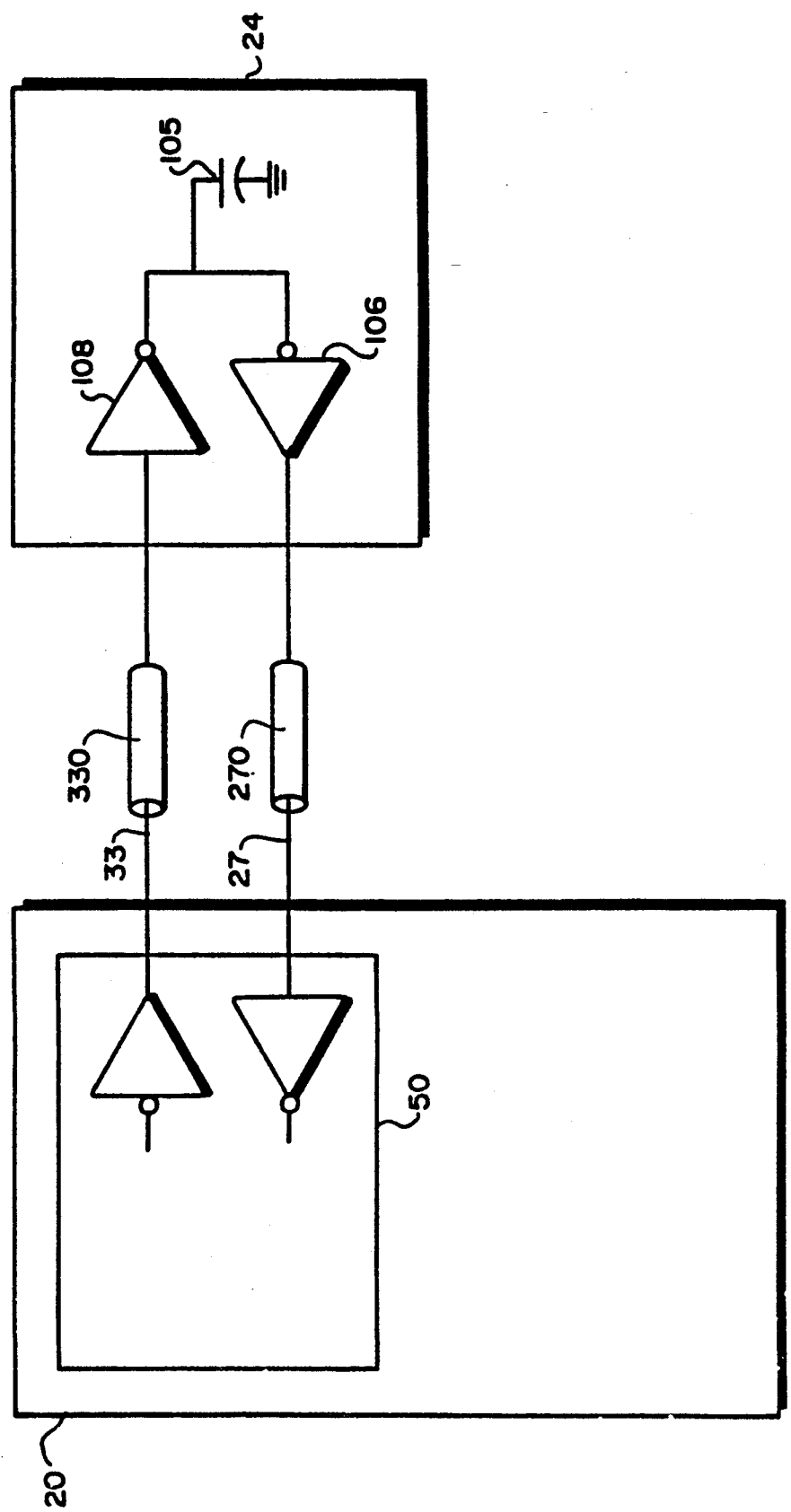
FIG. 10 is a diagram of portions of the replica loop circuit interfacing to a remote chip in accordance with a remote sensing mechanism of the invention.

An extension of the replica loop aspect of the invention involves remote sensing, which effectively adds additional "module-level" propagation delays into the replica loop 50. Specifically, the internal clock distribution path of circuitry, e.g., a bus interface chip 24 (FIG. 1), external to the repeater chip 20 is replicated within the loop 50. FIG. 10 illustrates a diagram of portions of the replica loop circuit 50 within the repeater chip 20 interfacing to a bus interface chip 24 in accordance with the remote sensing mechanism provided by signals LOOPIN and LOOPOUT on interface pins 33 and 27, respectively (FIG. 2). Here, the extra delays, which include "round-trip" module etch to the bus interface chip 24, are simulated by means of etch lines 270 and 330 included in the external part of the replica loop 50, and a clock input receiver 108 and an output driver 106 on the remote chip 24. Capacitor 105 replicates "on-chip" clock load capacitance on remote chip 24. This allows the clock repeater chip 20 to regulate clock skew of both the repeater chip and its associated bus interface chip 24.

Any group of clock signal phases to a bus interface chip destination may be handled with one replica loop and associated groups of PVTL clock delay paths. Moreover, multiple external chips may be serviced by including multiple replica loops and associated logic circuitry. For several destination chips of any technology or mix of technologies, a separate replica loop 50 and PVTL clock delay path 60 are required for each destination. An advantage of the remote sensing enhancement is that only one clock repeater chip 20 is required per module.

Improved Measurement Reference Generation

As noted, the PVTL delay regulator uses a measurement latch 66 (FIG. 6) to capture the results of the chip's inherent propagation delay; the amount of time the latch remains open is thus significant to overall PVTL delay regulation. Accordingly, the accuracy of the measurement pulse generated by the pulse generator 90 (FIG. 9) is also significant and any error in its generation appears as an error in the overall PVTL delay regulation, i.e., the length of time the measurement latch is open. A potential error in the measurement pulse period may arise because of non-symmetrical rise and fall times of the pulse. These non-symmetrical times may be caused, in turn, by process variations during manufacture of the chip 20.

As an alternative to the measurement pulse period, a non-pulse time reference (NPTR) generation technique establishes a measurement period by measuring the time between successive "like" edges of generated pulses. That is, the NPTR technique does not develop a specified digital pulse for measuring the clock repeater chip's inherent propagation delay; instead, the reference is based on a pair of coincident rising-falling edges of generated pulses exactly one measurement interval after a rising edge of the system input clock signal. It should be noted that the amount of time between successive "like" edges is always an integral number of system clock cycles. As a result, the NPTR generator's reference is not affected by non-symmetrical rise and fall times of a specified measurement pulse.

Figure 11:
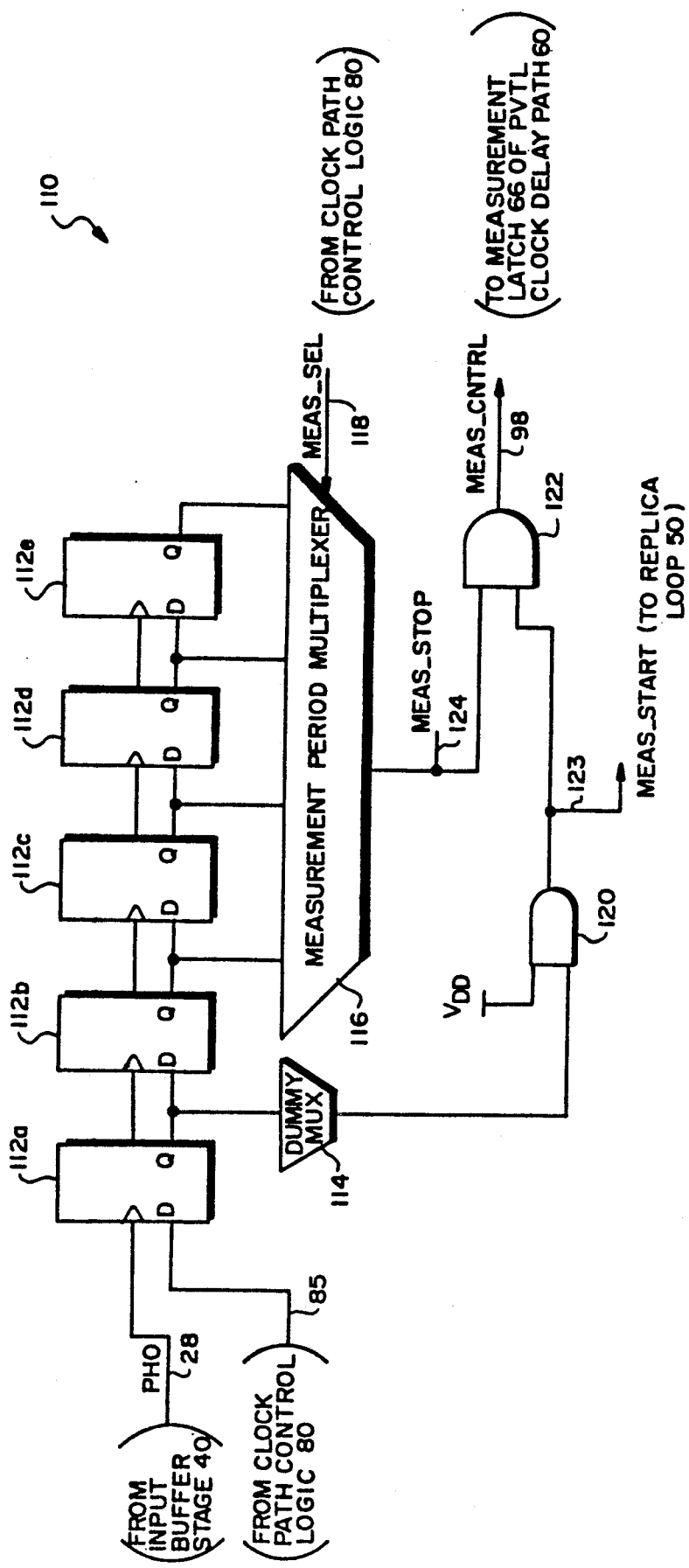
FIG. 11 is a diagram of a NPTR circuit in accordance with the invention.

FIG. 11 is a diagram of the NPTR circuit 110 including five cascaded D-type flip-flop devices 112a–e configured as a "measurement timing chain". Specifically, the Q-outputs of each device are coupled to the D-inputs of an adjacent device. The Q-output of the first device 112a is also coupled to a single input "dummy" multiplexer 114, while the Q-outputs of the remaining four devices are also coupled to a four-input measurement period multiplexer 116. The system clock signal PH0 on line 28 clocks the devices 112. The D-input of the first device 112a is coupled to a MEAS_EN signal on line 85 and the select input of the measurement period multiplexer 116 is connected to MEAS_SEL signals on line 118; these signals are generated by the clock path control logic 80 (FIG. 8).

The output of the dummy mux 114 is coupled to one input of a first two-input AND gate 120, while the other input is coupled to VDD. The output of the first AND gate, i.e. MEAS_START on line 123, is coupled to one input of a second two-input AND gate 122; the other input is the output of the measurement period multiplexer, i.e., MEAS_STOP on line 124. The output of the second AND gate 122 is a MEAS_CNTRL signal on line 98.

Figure 11A:
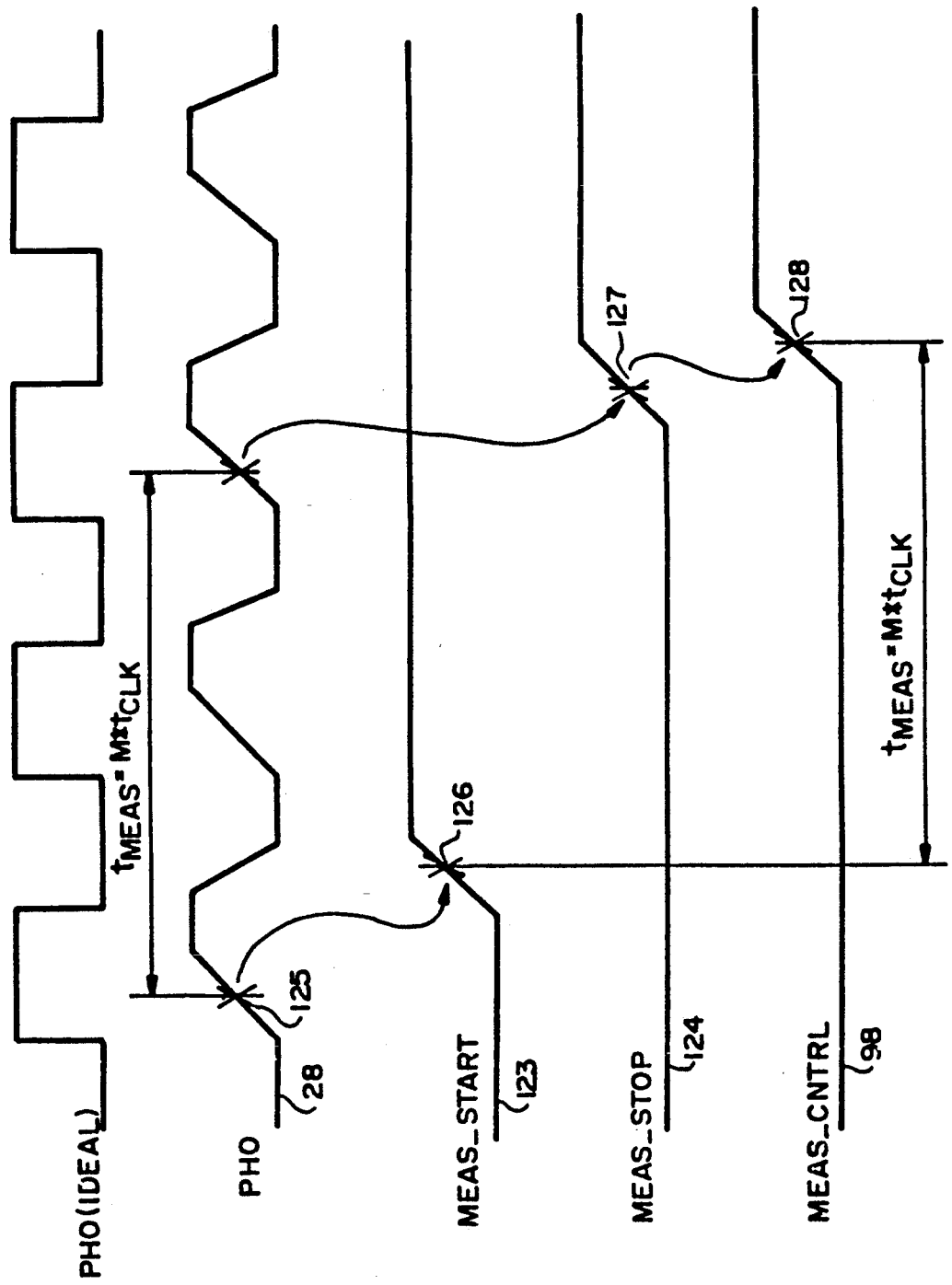
FIG. 11A is a timing diagram of signals generated by the NPTR circuit of FIG. 11.

Refer also to FIG. 11A for a timing diagram of signals generated by the NPTR circuit 110 as the operation of the circuit is described. At the beginning of a PVTL delay regulation cycle, the MEAS_EN signal (not shown) is asserted before the next system PH0 clock signal rising edge. This signal is asserted during the PVTL measurement time interval $t_{meas}$. The first rising edge 125 of the PH0 clock signal on line 28 after assertion of MEAS_EN, in turn, asserts the MEAS_START signal at 126 on line 123, which is used to drive the replica loop 50. The MEAS_STOP signal on line 124 is generated from a Q-output of a selected flip-flop 112 of the timing chain. As noted, the MEAS_STOP and MEAS_START signals are coupled to the inputs of AND gate 122 to generate the measurement latch control signal MEAS_CNTRL on line 98, which, when asserted at 128, causes the measurement latch 66 (FIG. 6) to close.

Improved Resolution—Fine-Grain Delay Line

As also noted, the delays lines 65 and 72 of the the PVTL clock delay path 60 (FIG. 6) are preferably implemented using tapped inverter strings. In order to maintain correct polarity, the taps are placed at the output of inverter-pairs 70 (FIG. 7); the resulting delay resolution, i.e., a unit of measurement, is an inverter-pair 70. Yet, other delay units of measurement may be employed within the teachings of the invention. For example, single inverters may be used to halve the delay unit "grain size", thereby doubling regulation accuracy.

In accordance with the invention, a fine-grain delay line allows taps at each inverter output of the delay line to provide twice the resolution performance improvement. When using each inverter of a delay line as a delay element, it is desirable to remove all inversions without adding delay offsets, i.e., extra inverters on the inverting taps. This is accomplished by using skew-neutral, "programmable" inverter gates.

Figure 12:
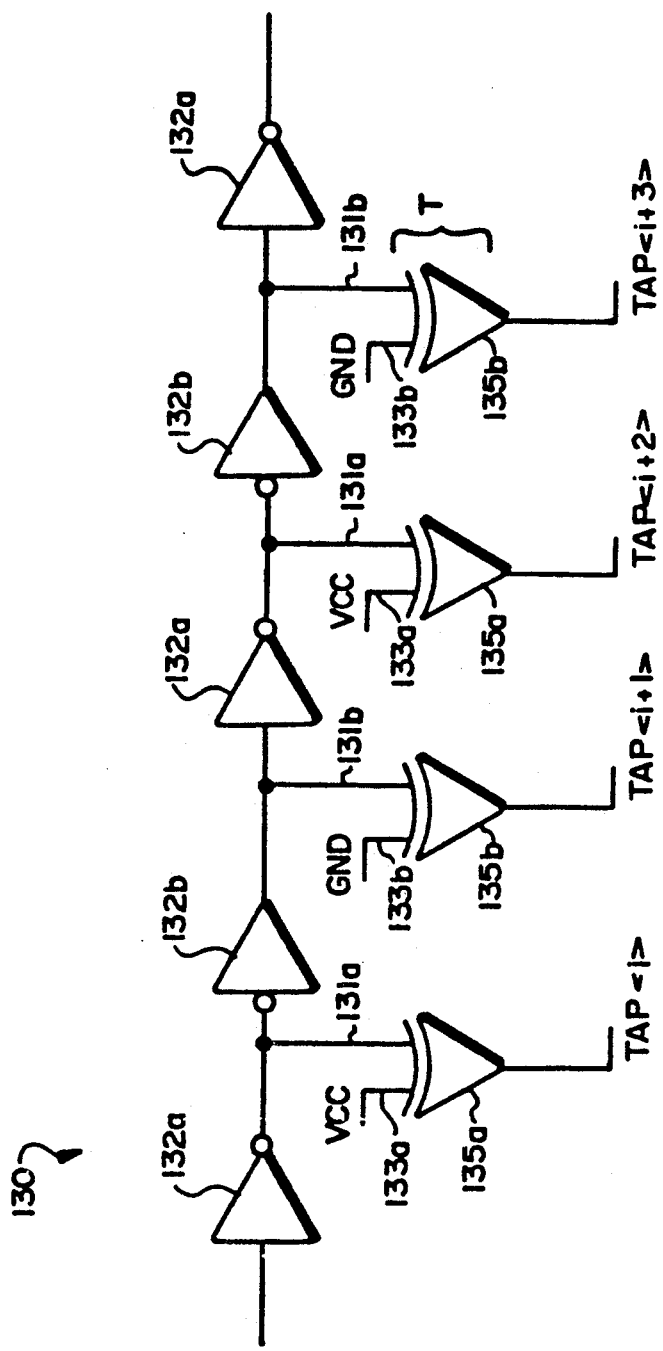
FIG. 12 is a diagram of a tapped fine-grain delay line including a low-skew, programmable inverter in accordance with the invention.

FIG. 12 is a diagram of a tapped fine-grain delay line 130 having programmable inverters 135 coupled to the taps 131. Alternate inverter gates 135a, having inputs coupled to the inverting taps 131a of inverters 132a, are "programmed" to invert, while the other inverter gates 135b, coupled to the non-inverting taps 131b, are programmed as non-inverting buffers. In general, it is desired to maintain a constant time delay T between the input and output of the gate 135, whether or not it is programmed to invert.

Specifically, each tap 131 of the fine-grain inverter line 130 is connected to one input of a programmable inverter gate 135. The other input 133 of the gate 135 is used as an "inversion control" input to provide proper polarity at the final tap output. The programmable inverter gate 135 thus provides "polarity correction" while maintaining constant speed independent of the voltage at its other input. The time delay between any two tap outputs is equal to the inverter delay difference between the taps.

Figure 13:
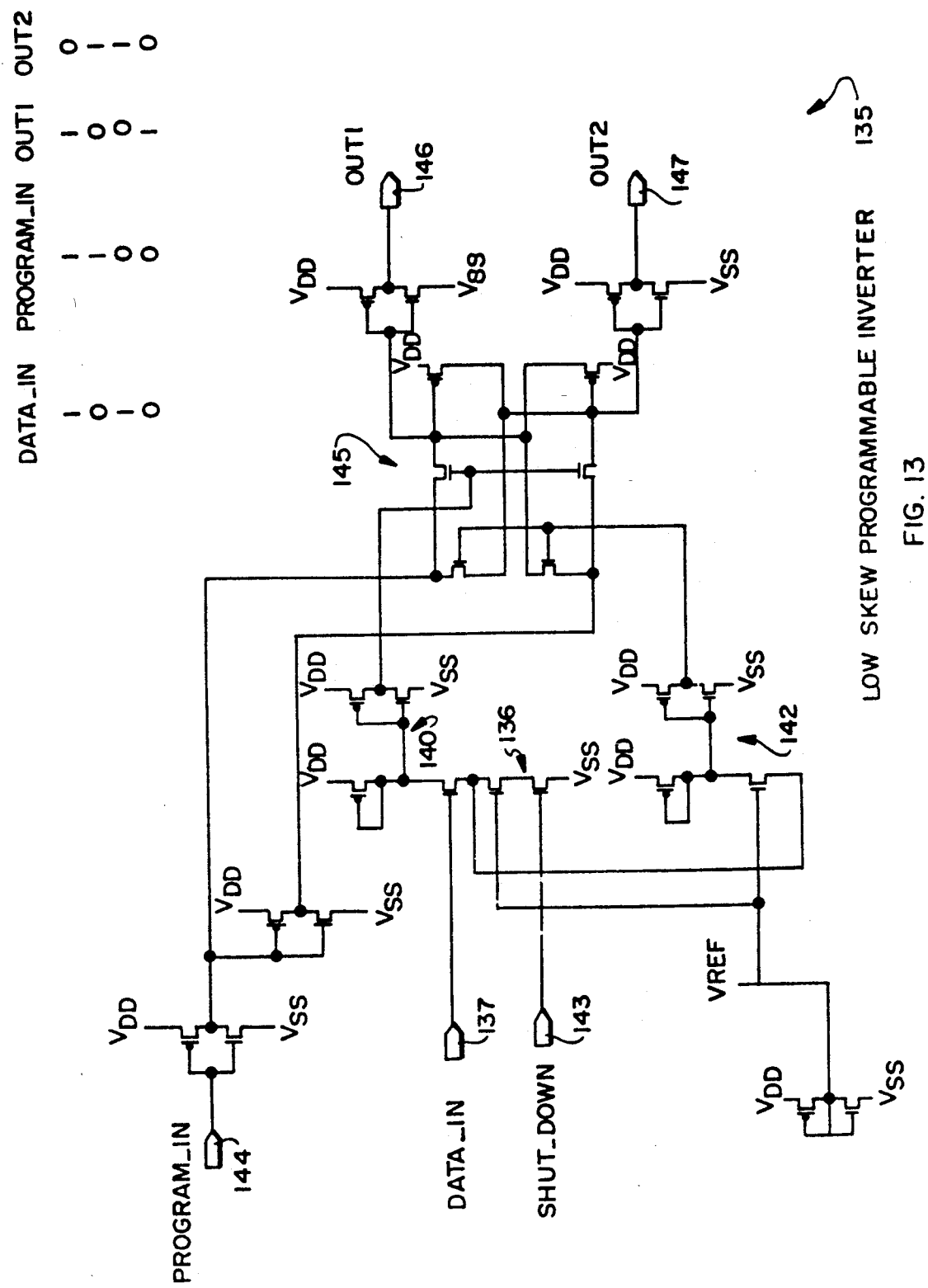
FIG. 13 is a diagram of the low-skew, programmable inverter of the fine-grain delay line of FIG. 13.

A low-skew, "programmable inverter" 135 used in the fine-grain delay line 130 is depicted at FIG. 13. The programmable inverter 135 comprises a current source circuit 136 including a differential amplifier having one input connected to DATA_IN on line 137. The current source circuit 136 is used to produce a low-skew inverted signal pair, which is then level-shifted by circuits 140 and 142 to a digital level and routed through a crossbar circuit 145. The output OUT1 and OUT2 on lines 146 and 147, respectively, of the programmable inverter 135 depends on the state of the PROGRAM_IN signal on line 144, which controls the routing of the signal pair through the crossbar circuit 145. Specifically, if the PROGRAM_IN signal is "high", the output is non-inverting with respect to the input. If the PROGRAM_IN signal is "low", the output is inverting with respect to the input. The SHUT_DOWN input signal on line 143 is used to "turn-off" the current source circuit 136 to conserve power.

Refer again to FIG. 12. When implementing the fine-grain delay line 130, certain input loading constraints of the programmable inverter gate 135 should be observed. Specifically, the minimum loaded input 131 of the gate 135 is connected to the output of the inverter 132. The other input 133 of the gate, which typically has higher loading, is used as the inversion selection input. These inputs 133 are connected to either VCC (133a) or GND (133b).

Overflow Mode Switching and Auto-Ranging

The clock frequency range over which PVTL delay regulation may be performed is determined by the min/max times of the regulator's delay lines 65 and 72, and replica loop 50 (FIG. 6). The input clock frequency range of the clock repeater chip 20 is described as:

$$t_{LOOPss} + t_{TAPss} < M^* t_{CLK} < t_{DLYff} + t_{LOOPff} - t_{TAPff}$$

where,
* m = a fixed integer value when m ≥ 1;
* $t_{CLK}$ = the clock cycle time;
* $t_{DLY}$ = the total time delay of the delay line;
* $t_{LOOP}$ = the total time delay of the PVTL replica loop;
* $t_{TAP}$ = the incremental time delay per tap; and
ss = worst-case "slow" chip; and
ff = worst-case "fast" chip.

PVTL auto-ranging extends the dynamic range of delay regulation by changing the number of clock cycles, m, that the input clock signal is delayed. Auto-ranging is based on the use of overflow flags in the PVTL clock delay path 60 (FIG. Specifically, there is an overflow tap of the measurement delay line 65 at 152, an overflow flag, i.e., latch bit, for the measurement latch 66 at 153, and an overflow latch bit for each A and B control register 68 at 154 and 155, respectively. The state of the overflow latch bits 154 and 155 are manifested as signals OVA on line 31 and OVB on line 32 and fed to both the mode control logic unit 30 and the clock path control logic unit 80.

In one embodiment of the invention, the mode control unit 30 (FIG. 3) examines the overflow flags and, if set, switches the chip 20 from the PVTL mode path 28 to the simple mode path 26 (FIG. 2). Mode switching is accomplished by asserting the SIMPLEMODE signal on line 37 and deassserting the PVTMODE signal on line 39 (FIG. 3); this enables the simple mode predrivers 46 of one of the two "wired-OR'ed" segments of the output buffer stage 45 (FIG. 4). The chip 20 is thus placed in a state in which it will work without a lower frequency limit, e.g., down to DC. For this embodiment, if it is determined that even one clock cycle time is too long, the control unit 30 switches the clock repeater chip into simple mode. However, clock skew will rise to a level inherent in the simple mode of operation, e.g., 4 ns.

In an alternate embodiment, the clock path control logic 80 (FIG. 8) examines the overflow flags OVA on line 31 and OVB on line 32, and alters the duration of the measurement pulse produced by the pulse generator 90 (FIG. 9) or the NPTR circuit 110 (FIG. 11) to establish an operating frequency range for the chip 20. Refer to the flow diagram 160 of FIG. 14 for a description of the sequence of operations performed during auto-ranging. Initially, a long measurement pulse, i.e., several clock periods in length, is produced by the pulse generator 90 or NPTR circuit 110 at step 164. A "slow" clock will cause the measurement pulse to "overflow" by propagating the entire length of the measurement delay line 65 (FIG. 6) and "off" the end of the line. Specifically, the measurement delay line 65 and measurement latch 66 are completely loaded with logic "1" bits during a measurement cycle at step 166. The overflow tap 152 located at the end of the measurement delay line 65 couples the pulse to the "overflow bit" 153 of the measurement latch 66, thereby setting the bit 153 to detect this condition. The control logic 80 then examines the A and B overflow bits 154 and 155 at step 168; if set, both bits are immediately cleared and the procedure repeated with a next smaller clock period at steps 170-174. At this point if there is no overflow, the clock path control logic 80 asserts the appropriate CLK_TAP signal on line 182 (FIG. 8) for the pulse generator 90 (FIG. 9), or the MEAS_SEL signal on line 118 for the NPTR circuit 110 (FIG. 11) to select the proper clock duration;

the delay regulator circuit now operates within range and auto-ranging is complete (step 176). If overflow does occur at step 174 and the minimum pulse duration has been reached (step 178), then simple mode is effectively selected (step 180); otherwise, the procedure is again repeated with a smaller clock period.

The auto-ranging feature is particularly useful for testing during manufacture of a system employing the clock repeater chip 20 where slower speed operation is required. Here, operation below the minimum frequency range is detected and the chip is switched to simple mode.

An advantage of the delay regulation invention described herein is that the delay regulation circuit is fully contained within the clock repeater chip 20. Moreover, the delay regulator circuit requires no external control signals for operation. Thus, the regulator circuit accurately replicates the delays in the clock path circuits on the chip because it is subject to the same process, voltage, temperature and loading conditions as the latter circuits.

The foregoing description has been directed to specific embodiments of this invention. It will be apparent, however, that variations and modifications may be made to the described embodiments, with the attainment of some or all of its advantages. Therefore, it is the object of the appended claims to cover all such variations and modifications as come within the true spirit and scope of the invention.

What is claimed is:

1. In a clock repeater chip having signal processing circuit components configured to receive periodic input clock signals and distribute processed output clock signals, a delay regulator for maintaining a fixed-phase relationship between said processed output clock signals and said input clock signals, said delay regulator comprising:

means for generating a measurement pulse signal in response to one of said input signals, said measurement pulse signal having a leading edge and a trailing edge, and having a duration of an integral number of periods of said input signals;

means for replicating a propagation delay of said input clock signals through said signal processing circuit components by using logic circuits configured to simulate the propagation delays of said signal processing components, said generating means being connected to apply said measurement pulse signal to an input end of said replicating means;

means, connected to an output end of said replicating means, for measuring said replicated propagation delay in response to said trailing edge of said measurement pulse signal; and means responding to said measured propagation delay for adding a controlled amount of signal delay to the processed output clock signals provided by said signal processing circuitry, to allow said processed output clock signals to maintain said fixed-phase relationship with said input clock signals.

2. The delay regulator of claim 1 wherein said measuring means comprises a measurement delay line having a plurality of taps coupled to a measurement latch circuit.

3. The delay regulator of claim 2 wherein said measurement delay line is a string of inverters, said taps being at outputs of the respective inverters.

4. The delay regulator of claim 3 wherein each of said taps is coupled to a programmable inverter circuit having a current source configured to produce a low-skew inverted signal pair.

5. The delay regulator of claim 2 wherein said measurement delay line comprises a string of inverters and said plurality of taps are placed at outputs of inverter pairs.

6. The delay regulator of claim 5 wherein said replicating means comprises a replica loop circuit coupled to said measurement delay line.

7. The delay regulator of claim 6 wherein said generating means further includes means for transmitting said measurement pulse signal to said replica loop circuit and to said measurement latch circuit, such that said leading edge of said measurement pulse signal propagates through said replica loop and into said measurement delay line while said trailing edge of said measurement pulse signal closes said latch circuit, thereby storing a delay word in said latch.

8. The delay regulator of claim 7 wherein said transmitting means comprises a driver circuit of a measurement pulse generator.

9. The delay regulator of claim 7 wherein said adding means comprises at least one delay adjusting unit including a clock delay line configured to receive said input clock signals, said clock delay line having a plurality of taps coupled to respective inputs of a tap multiplexer.

10. The delay regulator of claim 8 wherein said adding means comprises at least one delay adjusting unit including a clock delay line configured to receive said input clock signals, said clock delay line having a plurality of taps coupled to respective inputs of a tap multiplexer.

11. Apparatus for reducing clock skew in a synchronous computer system including a plurality of modules configured to operate in response to received system clock signals, said apparatus comprising:
first means for generating said system clock signals;
means, coupled to said first generating means, for distributing said system clock signals to the modules with a substantially constant phase, each of the modules having an integrated clock repeater circuit including signal processing circuitry configured to receive said system clock signals from said distributing means and supply output clock signals to an external load, said signal processing circuitry including a variable delay element, each clock repeater circuit further comprising:
second means for generating a measurement pulse signal in response to one of said received system clock signals, said measurement pulse signal having a leading edge and a trailing edge;
means for replicating a propagation delay of said received clock signals through the components of said signal processing circuitry except for said variable delay element, said replicating means including logic segments configured to simulate substantially all of the components of said signal processing circuitry, said second generating means being connected to apply said measurement pulse signal to an input end of said replicating means;
means, coupled to an output end of said replicating means, for measuring said replicated propagation delay in response to said trailing edge of said measurement pulse signal; and
means for translating said measured replicated propagation delay to a controlled delay interval in response to the results of said measuring means such that said variable delay element responds to said translating means to provide said controlled delay interval to said system clock signals processed by said signal processing circuitry and distributed to said load and said constant phase relationship is maintained among said output clock signals on the modules.

12. The apparatus of claim 11 wherein said clock repeater circuit is contained on a single semiconductor chip.

13. The apparatus of claim 12 wherein said signal processing circuitry comprises:
means for shaping and amplifying said system clock signals; and
means for generating multiple copies of said amplified clock signals in response to said amplifying means.

14. The apparatus of claim 11 wherein said replicating means is a replica circuit and said logic segments simulate all of the components of said signal processing circuitry except for said variable delay element.

15. The apparatus of claim 14 wherein said replica circuit further comprises a loading network for simulating said external load.

16. The apparatus of claim 14 wherein said measuring means includes a measurement delay line connected to said replica circuit and having a plurality of taps coupled to a measurement latch circuit.

17. The apparatus of claim 16 wherein said generating means further includes means for transmitting said measurement signal to said replica circuit and to said measurement latch circuit, such that said leading edge of said measurement signal propagates through said replica circuit, into said measurement delay line and through said taps, said trailing edge of said measurement signal closing said latch circuit thereby storing the states of said taps to indicate the position of said leading edge of said measurement signal in said measurement delay line.

18. The apparatus of claim 17 wherein said means for translating comprises a decoder circuit of said measurement latch configured to decode the states of said taps to a tap select word having a transition point at the position of said leading edge of said measurement signal in said measurement delay line.

19. The apparatus of claim 18 wherein said translating means further comprises a tap multiplexer having inputs selectively enabled by said tap select word.

20. The apparatus of claim 19 wherein said variable delay element is a tapped clock delay line with a plurality of taps and said tap multiplexer has inputs connected to respective taps of said tapped clock delay line such that enablement of said multiplexer by said tap select word selects one of said plurality of taps of said tapped clock delay line to thereby control the signal delay in said signal processing circuitry.

21. The apparatus of claim 20, wherein said tapped clock delay line is a string of inverters and said plurality of taps are at outputs of inverter pairs.

22. The apparatus of claim 11 wherein said means for distributing comprises separate, generally radial unidirectional clock lines.

23. The apparatus of claim 11 wherein said means for generating said system clock signals is a system clock generator.

24. The apparatus of claim 13 wherein said means for shaping and amplifying comprises a differential amplifier circuit coupled to a post-amplifier circuit functioning as a level-shifter.

25. The apparatus of claim 24 wherein said means for generating multiple copies comprises predriver circuitry.

26. The apparatus of claim 25 wherein said predriver circuitry includes AND and NAND gates.

* * * * *